United States Patent [19]
Huang

[11] Patent Number: 6,026,107
[45] Date of Patent: Feb. 15, 2000

[54] SEMICONDUCTOR OPTICAL FUNCTIONAL DEVICE AND METHOD OF DRIVING THE SAME

[75] Inventor: Yidong Huang, Tokyo, Japan

[73] Assignee: NEC Corporation, Tokyo, Japan

[21] Appl. No.: 08/965,614

[22] Filed: Nov. 6, 1997

[30] Foreign Application Priority Data

Nov. 6, 1996 [JP] Japan ..................................... 8-293895

[51] Int. Cl.$^7$ ....................................................... H01S 3/19
[52] U.S. Cl. ................................. 372/50; 372/43; 372/44; 372/45; 372/105; 372/106
[58] Field of Search ................................. 372/19, 21, 22, 372/23, 27, 43, 50, 45, 46, 105, 106

[56] References Cited

U.S. PATENT DOCUMENTS

| | | | |
|---|---|---|---|
| 5,117,469 | 5/1992 | Cheung et al. | 385/11 |
| 5,155,737 | 10/1992 | Ikeda et al. | 372/43 |
| 5,757,828 | 5/1998 | Ouchi | 372/27 |
| 5,757,832 | 5/1998 | Uchida | 372/45 |
| 5,901,166 | 5/1999 | Nitta et al. | 372/50 |

FOREIGN PATENT DOCUMENTS

| | | | |
|---|---|---|---|
| 0469681 | 2/1992 | European Pat. Off. | 372/43 X |
| 0484923 | 5/1992 | European Pat. Off. | 372/43 X |
| 5-243551 | 9/1993 | Japan | 372/43 X |
| 6-180405 | 6/1994 | Japan | 372/43 X |
| 7-249832 | 9/1995 | Japan | 372/43 X |
| 8-8491 | 1/1996 | Japan | 372/43 X |

OTHER PUBLICATIONS

Dubovitsky S. et al: "Wavelength Conversion in a Quantum Well Polarization Insensitive Amplifier" IEEE Photonics Technology Letters, vol. 6, No. 7, Jul. 1, 1994, pp. 804–807.
Patent Abstracts of Japan vol. 010, No. 376 (E–464), Dec. 13, 1986.

*Primary Examiner*—Brian Healy
*Attorney, Agent, or Firm*—Sughrue, Mion, Zinn, MacPeak & Seas, PLLC

[57] ABSTRACT

A semiconductor optical functional device is divided into two regions of a first region 1 and a second region 2 adjacent to each other in a longitudinal direction of a semiconductor optical waveguide. The first region 1 is provided with a region including an MQW structure in which a compressive strain is introduced, and the second region 2 is provided with a region including an MQW structure in which a tensile strain is introduced. Electrodes 3 and 4 formed separately and independently from each other are respectively disposed on the first region 1 and the second region 2, and bias voltages applied to the electrodes 3 and 4 are adjusted so that transmissivities for light having a TE mode component and light having a TM mode component are independently controlled.

7 Claims, 6 Drawing Sheets

SEMICONDUCTOR OPTICAL FUNCTIONAL DEVICE AND METHOD OF DRIVING THE SAME

BACKGROUND OF THE INVENTION

1. Field of the Invention

The present invention relates to a semiconductor optical functional device, and particularly to an optical functional device which is used for an optical fiber communication system and is capable of performing mode conversion, mode filtering, or optical amplification with respect to a TE mode and a TM mode which are polarization modes in which light orthogonally intersects.

2. Description of the Related Art

Up to now, a semiconductor laser has been often used as a light source in a ultra high speed and long distance optical fiber communication system.

However, in a conventional semiconductor laser, there is a fear that a noise occurs in the inside of the semiconductor laser due to minute reflected returning light from an optical fiber so that a transmission code error occurs.

Thus, in an optical fiber communication system using a semiconductor laser, an optical isolator is generally employed to remove the light returning to the semiconductor laser.

In the above described conventional communication system, the optical isolator is used to remove the returning light to the semiconductor laser. However, the optical isolator requires a number of steps for processing and assembling materials, and is not only expensive but also poor in reliability and stability. Thus, when the optical isolator is used for an optical fiber communication system, there arises a problem that the reliability and stability of the whole system are damaged.

SUMMARY OF THE INVENTION

The present invention has been made in view of the above described problem possessed by the conventional technique, and an object thereof is therefore to provide a semiconductor optical functional device which is capable of removing returning light to a semiconductor laser without using an optical isolator.

In order to achieve the above object, according to the present invention, a semiconductor optical functional device is constituted by two regions of a first region and a second region adjacent to each other in a longitudinal direction of a semiconductor optical waveguide, and is characterized in that the first region has an MQW (Multiple Quantum Well) structure in which a compressive strain is introduced to a well, and the second region has an MQW structure in which a tensile strain is introduced to a well.

Also, according to the present invention, in the semiconductor optical functional device of the invention, the first region and the second region are provided with electrodes formed separately and independently from each other, and the first region and the second region perform an amplifying operation when a forward bias voltage is applied to the electrodes, and perform an absorbing operation when a reverse bias voltage is applied to the electrodes.

Also, according to the present invention, a method of driving the semiconductor optical functional device of the second aspect is characterized in that a reverse bias voltage is applied to the electrode disposed on the first region; and a forward bias voltage is applied to the electrode disposed on the second region, whereby when light having a TE mode component is inputted into the first region, the semiconductor optical functional device is driven as a semiconductor integrated polarization mode converter which converts the incident light into light having a TM mode component and outputs the converted light.

Also, according to the present invention, a method of driving the semiconductor optical functional device of the second aspect is characterized in that a forward bias voltage is applied to the electrode disposed on the first region; and a reverse bias voltage is applied to the electrode disposed on the second region, whereby when light having a TM mode component is inputted into the first region, the semiconductor optical functional device is driven as a semiconductor integrated polarization mode converter which converts the incident light into light having a TE mode component and outputs the converted light.

Also, according to the present invention, a method of driving the semiconductor optical functional device of the second aspect is characterized in that a reverse bias voltage is applied to the electrode disposed on the first region; and a forward bias voltage is applied to the electrode disposed on the second region, the forward bias voltage being so small that laser oscillation does not occur in the second region, whereby when light having a TE mode component and a TM mode component is inputted into the first region, the semiconductor optical functional device is driven as a semiconductor integrated polarization mode filter which makes only the light having the TM mode component pass through and outputs the passed light.

Also, according to the present invention, a method of driving the semiconductor optical functional device of the second aspect is characterized in that a forward bias voltage is applied to the electrode disposed on the first region, the forward bias voltage being so small that laser oscillation does not occur in the first region; and a reverse bias voltage is applied to the electrode disposed on the second region, whereby when light having a TE mode component and a TM mode component is inputted into the first region, the semiconductor optical functional device is driven as a semiconductor integrated polarization mode filter which makes only the light having the TE mode component pass through and outputs the passed light.

Also, according to the present invention, a method of driving the semiconductor optical functional device is characterized in that adjusted forward bias voltages are respectively applied to the electrodes disposed on the first region and the second region, whereby when light having a TE mode component and a TM mode component is inputted into the first region, the semiconductor optical functional device is driven as an integrated polarization mode independent amplification semiconductor optical amplifier which controls the respective gains of the TE mode component and the TM mode component independently to output light from the second region.

BRIEF DESCRIPTION OF THE DRAWINGS

The above and other objects, advantages and features of the present invention will be more apparent from the following description taken in conjunction with the accompanying drawing in which.

DETAILED DESCRIPTION OF THE INVENTION

Operation principles of a semiconductor optical functional device according to the present invention will be hereinafter described.

First, an operation principle in the case where the semiconductor optical functional device of the present invention is used as a semiconductor integrated polarization mode converter, will be described.

Figure 1A:
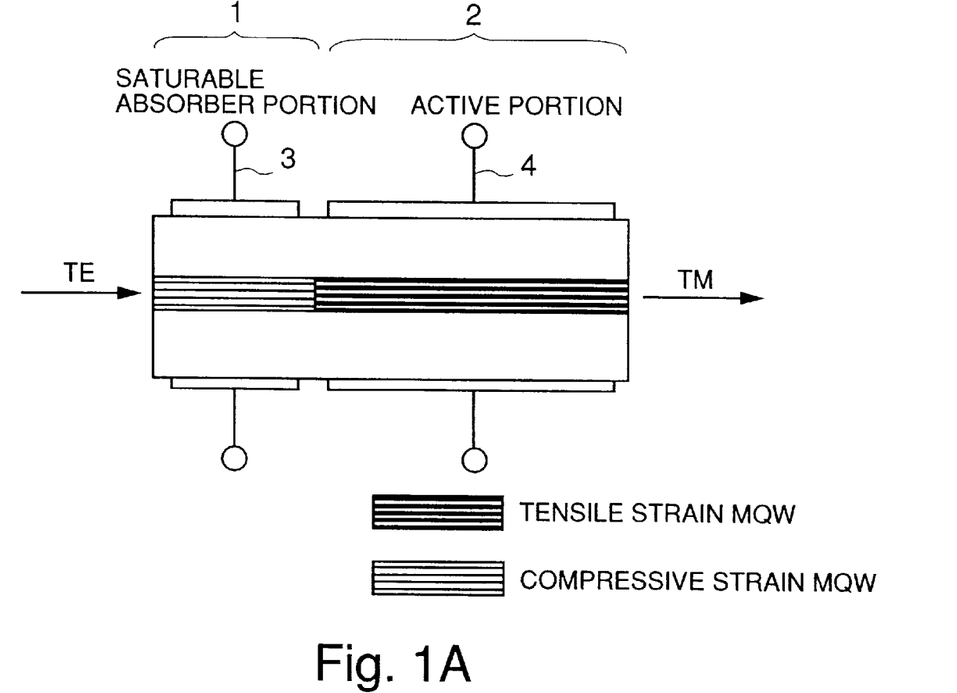
FIGS. 1A and 1B are views for explaining an operation principle in the case where a semiconductor optical functional device of the present invention is activated as a semiconductor integrated polarization mode converter, FIG. 1A being a sectional view showing the structure thereof, and FIG. 1(b) being a view showing the dependency of oscillator net gain and power of TM mode light which is to be oscillated, with respect to the input power of TE mode light.
Figure 1B:
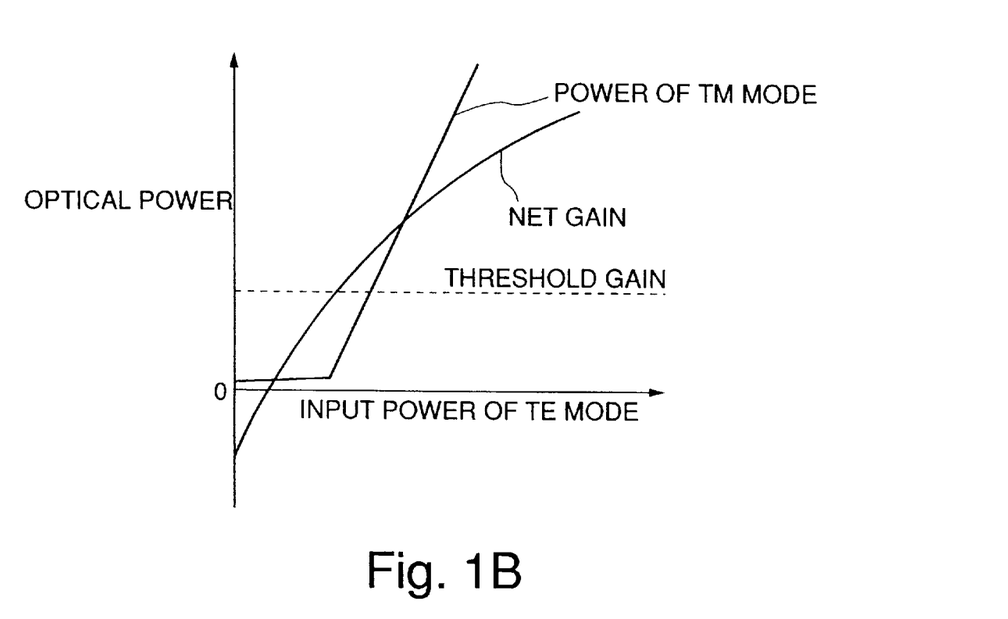

FIGS. 1A and 1B are views for explaining the operation principle in the case where the semiconductor optical functional device of the present invention is activated as the semiconductor integrated polarization mode converter, FIG. 1A being a sectional view showing the structure thereof, and FIG. 1B being a view showing the dependency of oscillator net gain and power of TM mode light which is to be oscillated, with respect to input power of TE mode light.

As shown in FIG. 1A, the structure of the semiconductor integrated polarization mode converter is the same as that of a semiconductor laser including a multiple oscillator structure. That is, an oscillator using a normal laser is divided into two regions of a first region and a second region adjacent to each other in a longitudinal direction of a semiconductor optical waveguide. The first region 1 is provided with a region having an MQW structure in which a compressive strain is introduced into a well, and the second region 2 is provided with a region having an MQW structure in which a tensile strain is introduced into a well. Further, electrodes 3 and 4 formed separately and independently from each other are disposed on the first region 1 and the second region 2, respectively.

If the compressive strain or the tensile strain is introduced into a quantum well, the band structure of the well is changed. Here, with respect to the compressive strain MQW, since the first level of a valence band thereof is an HH band, the region performs an amplifying or absorbing operation with respect to light of the TE mode. On the other hand, in the tensile strain MQW, since the first level of a valence band thereof is an LH band, the region performs an amplifying or absorbing operation with respect to light of the TM mode. Whether the amplifying operation is performed or absorbing operation is performed, is controlled by a voltage applied to the electrodes provided on the respective regions. When the voltage applied to the electrode is a forward bias voltage, the amplifying operation is performed, and when the applied voltage is a reverse bias voltage, the absorbing operation is performed.

Considering the case where the reverse bias voltage is applied to the first region having the compressive strain MQW structure, the forward bias voltage is applied to the second region having the tensile strain MQW structure, and light having the TE mode component is inputted into the first region 1.

As shown in FIG. 1B, as the input power of the TE mode increases, the incident light having the TE mode component is absorbed in the region having the compressive strain MQW structure in the first region 1, so that the loss of a multiple oscillator is decreased, and the net gain is increased. When the net gain exceeds a threshold gain, light having the TM mode component is oscillated from the region having the tensile strain MQW structure in the second region 2, so that emitted light having the TM mode component is obtained.

In this way, the incident light having the TE mode component is converted into the light having the TM mode component.

Also, in the state where the forward bias voltage is applied to the first region 1 having the compressive strain MQW structure, and the reverse bias voltage is applied to the second region 2 having the tensile strain MQW structure, when light having the TM mode component is inputted into the first region 1, the incident light having the TM mode component is converted into the light having the TE mode component by the principle similar to the above.

Next, an operation principle as a semiconductor integrated polarization mode filter will be described.

Figure 2A:
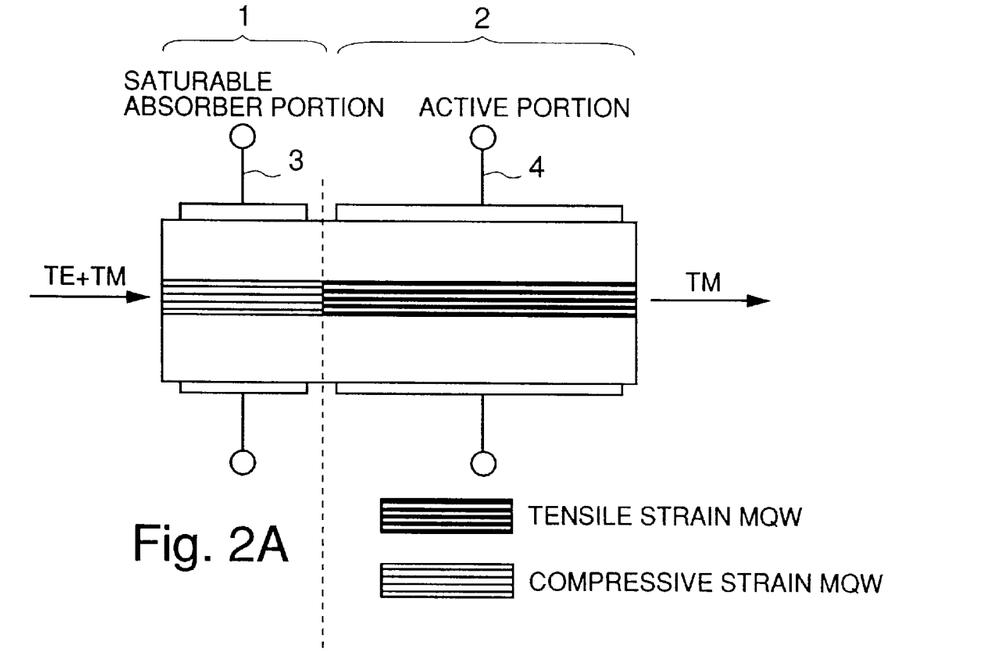
FIGS. 2A and 2B are views for explaining an operation principle in the case where a semiconductor optical functional device of the present invention is activated as a semiconductor integrated polarization mode filter, FIG. 2A being a sectional view showing the structure thereof, and FIG. 2B being a view showing the distribution of electric field in the respective TE mode and TM mode.
Figure 2B:
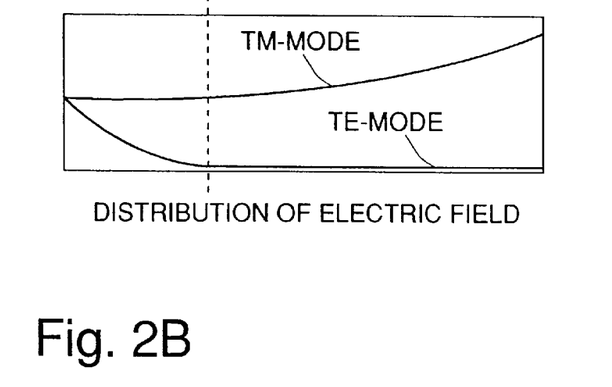

FIGS. 2A and 2B are views for explaining the operation principle in the case where a semiconductor optical functional device of the present invention is activated as the semiconductor integrated polarization mode filter, FIG. 2A being a sectional view showing the structure thereof, and FIG. 2B being a view showing the distribution of electric field in the respective TE mode and TM mode.

As shown in FIG. 2A, the structure of the semiconductor integrated polarization mode filter is the same as that of the semiconductor integrated polarization converter as shown in FIG. 1A. However, in order to activate the semiconductor optical functional device as the semiconductor integrated polarization converter, a forward bias voltage applied to the first region 1 or the second region 2 is made so small that laser oscillation does not occur in the region to which the forward bias is applied.

For example, as shown in FIG. 2A, in the case where a reverse bias voltage is applied to the first region 1 having the compressive strain MQW structure, a forward bias voltage, which is so small that laser oscillation is not caused, is applied to the second region 2 having the tensile strain MQW structure, and light having two mode components of TE and TM is inputted into the first region 1, as shown in FIG. 2B, in the TE mode component and the TM mode component of the incident light, the TE mode component is absorbed in the region having the compressive strain MQW structure in the first region 1, and only light having the TM mode component is emitted from the region having the tensile strain MQW structure in the second region 2.

Also, in the case where a forward bias voltage, which is so small that laser oscillation is not caused, is applied to the first region 1 having the compressive strain MQW structure, a reverse bias voltage is applied to the second region 2 having the tensile strain MQW structure, and light having two mode components of TE and TM is inputted into the first region 1, in the TE mode component and the TM mode component of the incident light, the TM mode component is absorbed in the region having the tensile strain MQW structure in the second region 2, and only light having the TE mode component is emitted from the region having the tensile strain MQW structure in the second region 2.

As a result, the semiconductor optical functional device of the present invention can also be activated as the semiconductor integrated polarization mode filter for selectively removing the TE mode component or TM mode component of the incident light.

Next, an operation principle as an integrated polarization mode independent amplification semiconductor optical amplifier will be described.

Figure 3A:
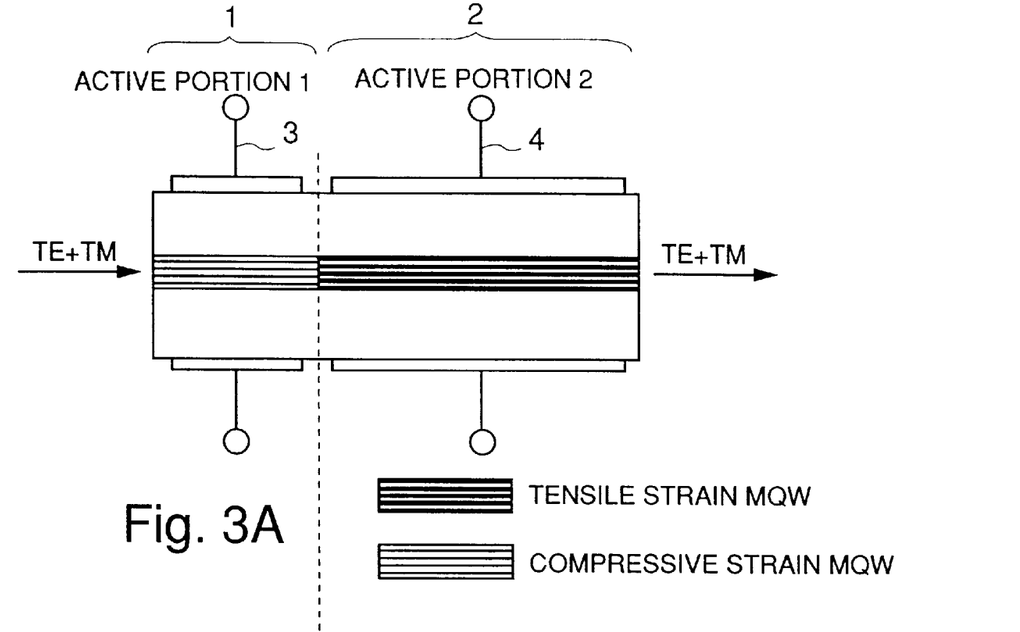
FIGS. 3A and 3B are views for explaining an operation principle in the case where a semiconductor optical functional device of the present invention is activated as an integrated polarization mode independent amplification semiconductor amplifier, FIG. 3A being a sectional view showing the structure thereof, and FIG. 3B being a view showing the distribution of electric field in the respective TE mode and TM mode.
Figure 3B:
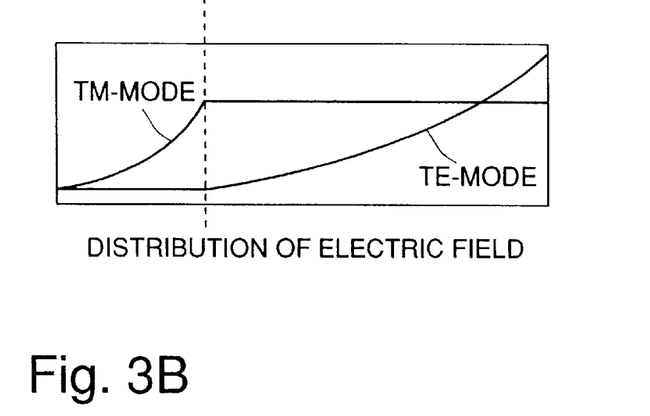

FIGS. 3A and 3B are views for explaining the operation principle in the case where a semiconductor optical functional device of the present invention is activated as the integrated polarization mode independent amplification semiconductor amplifier, FIG. 3A being a sectional view showing the structure thereof, and FIG. 3B being a view showing the distribution of electric field in the respective TE mode and TM mode.

As shown in FIG. 3A, the structure of the integrated polarization mode independent amplification semiconductor optical amplifier is the same as that of the semiconductor integrated polarization converter shown in FIG. 1A. However, in order to activate the semiconductor optical functional device as the integrated polarization mode independent amplification semiconductor optical amplifier, forward bias voltages are applied to the first region 1 and the second region 2, and the bias voltages applied to the respective regions are adjusted so that gains of the respective TE mode and TM mode can be independently controlled.

In the case where forward bias voltages are applied to the first region 1 and the second region 2, and light having two mode components of TE and TM is inputted into the first region 1, as is understood from the distribution of electric field of the TE mode and TM mode shown in FIG. 3B, the light power of the TE mode and TM mode of the incident light is respectively amplified in the gain regions of the first region 1 and the second region 2, so that the semiconductor optical functional device functions as the integrated polarization mode independent amplification semiconductor optical amplifier.

Preferred embodiments will next be described below with reference to the drawings.

Figure 4A:
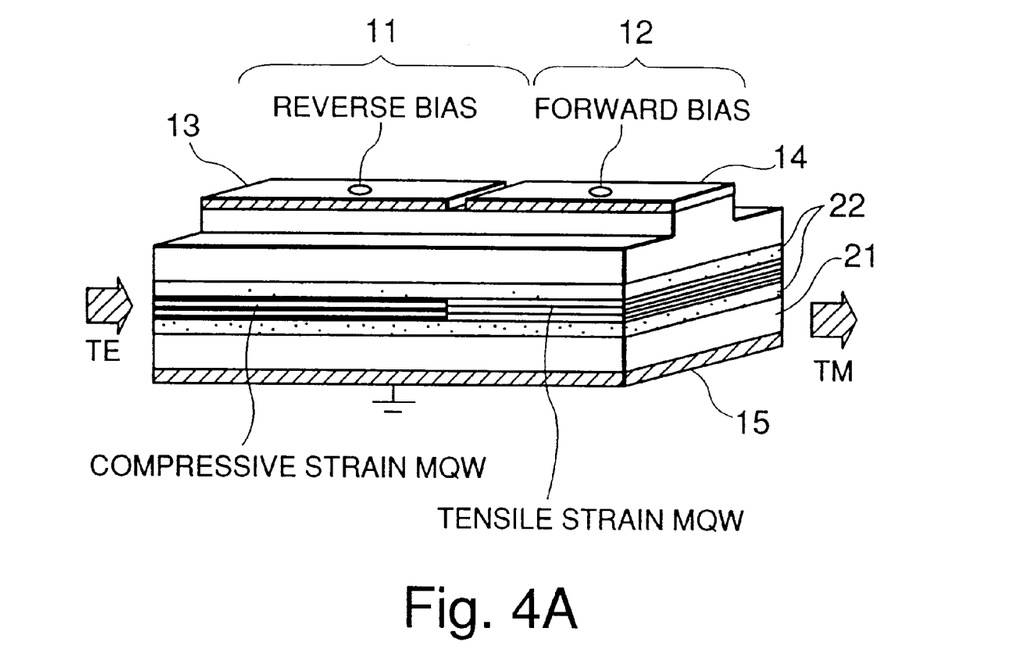
FIGS. 4A and 4B are views showing an embodiment in which a semiconductor optical functional device of the present invention is used as a semiconductor integrated polarization mode converter, FIG. 4A being a sectional view showing an example in which light of a TE mode component is converted into light of a TM mode component, and FIG. 4B being a view showing an example in which light of a TM mode component is converted into light of a TE mode component.
Figure 4B:
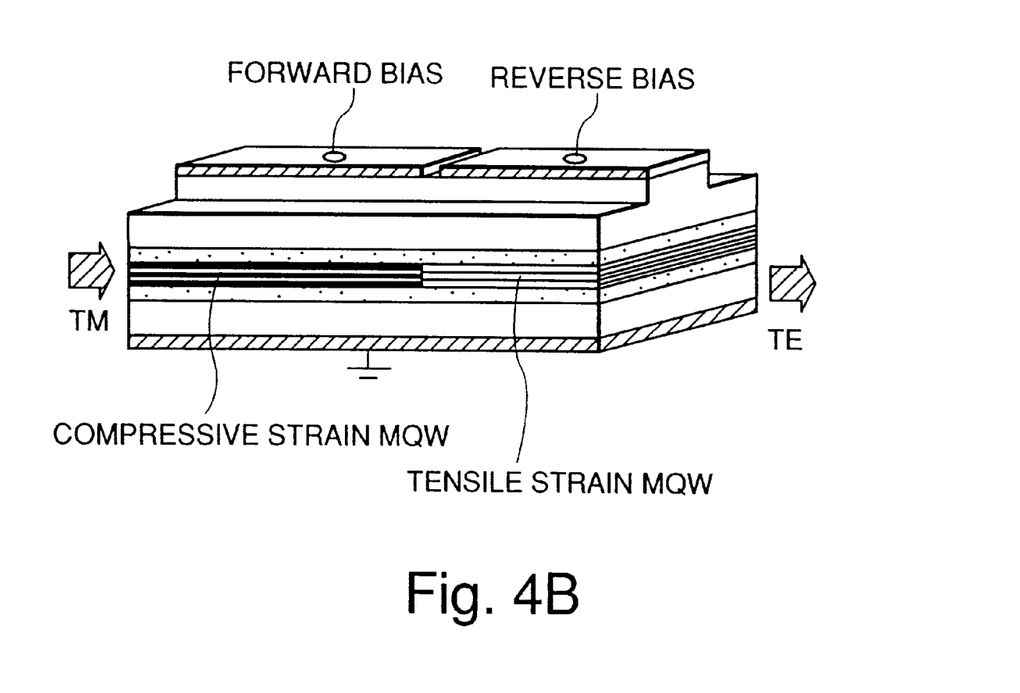

FIGS. 4A and 4B are views showing an embodiment in which a semiconductor optical functional device of the present invention is used as a semiconductor integrated polarization mode converter, FIG. 4A being a sectional view showing an example in which light of a TE mode component is converted into light of a TM mode component, and FIG. 4B being a view showing an example in which light of the TM mode component is converted into light of the TE mode component.

A method of producing the semiconductor optical functional device shown in FIG. 4 will be described below.

First, an InGaAsP cladding layer 22 is grown on an InP substrate 21, and then a compressive strain MQW structure and a tensile strain MQW structure adjacent to each other are formed by carrying out selective growth two times.

Next, the InGaAsP cladding layer 22 and the InP substrate 21 are subjected to embedded growth and a ridge waveguide with a width of 2 μm is formed by normal photolithography and etching.

Thereafter, a whole surface electrode 15 is formed on the lower surface of the InP substrate 21, and electrodes 13 and 14 independent from each other are formed on the upper surface of the semiconductor device which is divided into a first region 11 having the compressive strain MQW structure and a second region 2 having the tensile strain MQW structure.

In this embodiment, as is understood from the above described principle, an electric current is injected into the second region 12 having the tensile strain MQW structure, and a reverse bias voltage is applied to the first region 11 having the compressive strain MQW, so that the TE mode can be converted into the TM mode as shown in FIG. 4A.

Also, as shown in FIG. 4B, when a forward bias voltage is applied to the first region 11 having the compressive strain MQW structure, and a reverse bias voltage is applied to the second region 12 having the tensile strain MQW structure, conversion from the TM mode into the TE mode can be realized.

Figure 5A:
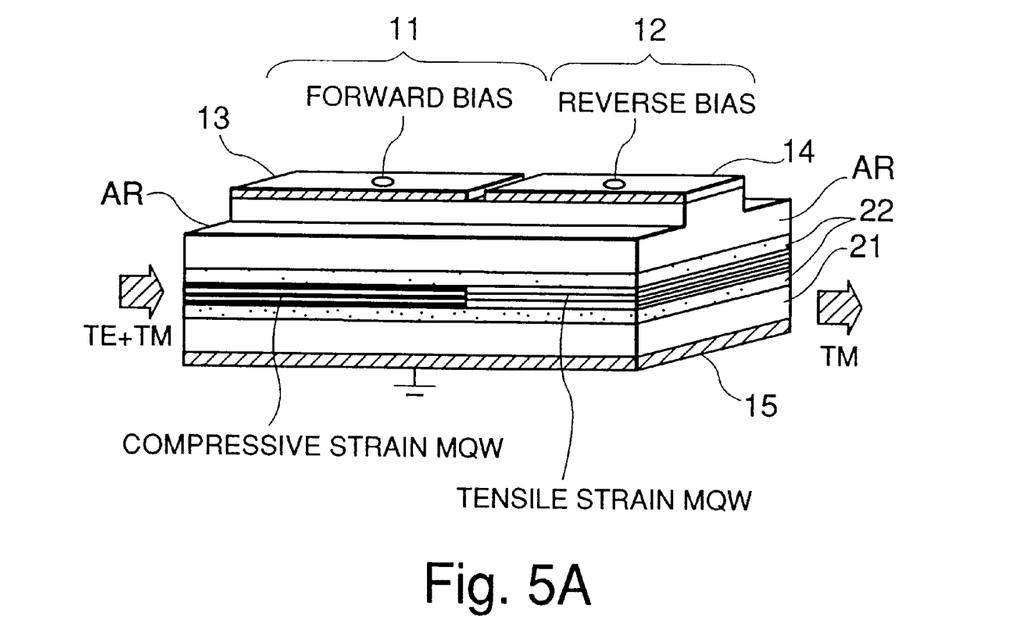
FIGS. 5A and 5B are views showing an embodiment in which a semiconductor optical functional device of the present invention is used as an integrated polarization mode filter, FIG. 5A being a view showing an example in which when light of a TE mode component and a TM mode component is inputted, only light of the TM mode component is emitted, and FIG. 5B being a view showing an example in which when light of a TE mode component and a TM mode component is inputted, only light of the TE mode component is emitted.
Figure 5B:
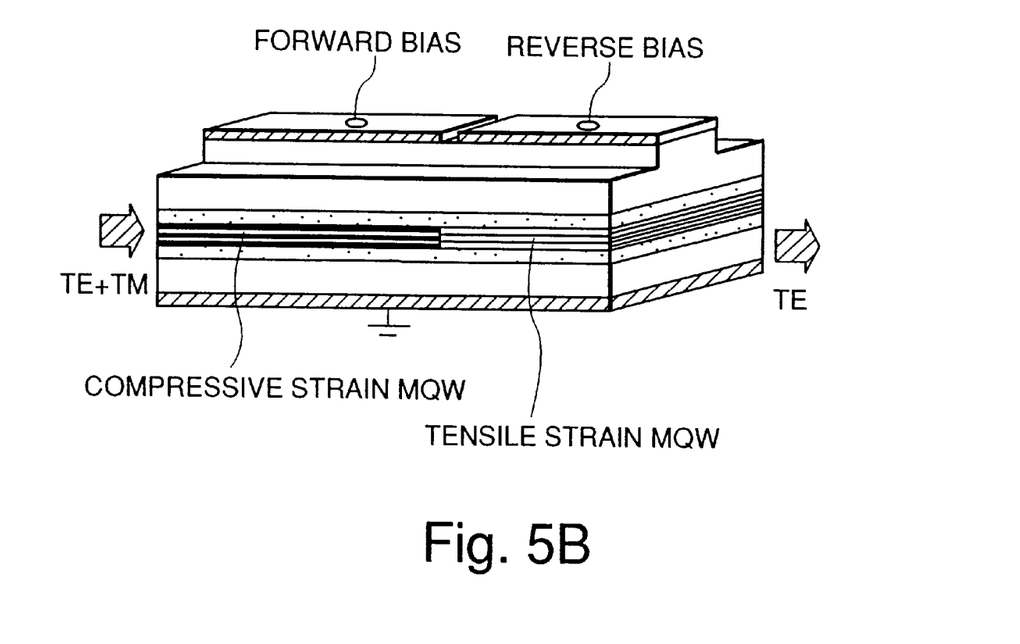

FIGS. 5A and 5B are views showing an embodiment in which a semiconductor optical functional device of the present invention is used as an integrated polarization mode filter. FIG. 5A is a view showing an example in which when light of the TE mode component and TM mode component is inputted, only light of the TM mode component is emitted, and FIG. 5B is a view showing an example in which when light of the TE mode component and TM mode component is inputted, only light of the TE mode component is emitted.

In order to activate the semiconductor optical functional device as the semiconductor integrated polarization mode filter, as shown in FIGS. 5A and 5B, AR films 23 are deposited to the structure shown in FIGS. 4A and 4B, and the value of forward bias voltage applied to the first region 11 or the second region 12 is made so small that laser oscillation does not occur in the region where the forward bias voltage is applied.

According to this, in the case where incident light has two modes of TE and TM, by selecting the way of applying bias voltages shown in FIG. 5A or 5B, the TE mode component or TM mode component of the incident light is selectively cut off, and only light of the remaining mode is amplified and is made to pass through. Accordingly, the semiconductor device functions as the semiconductor integrated polarization mode filter.

Figure 6:
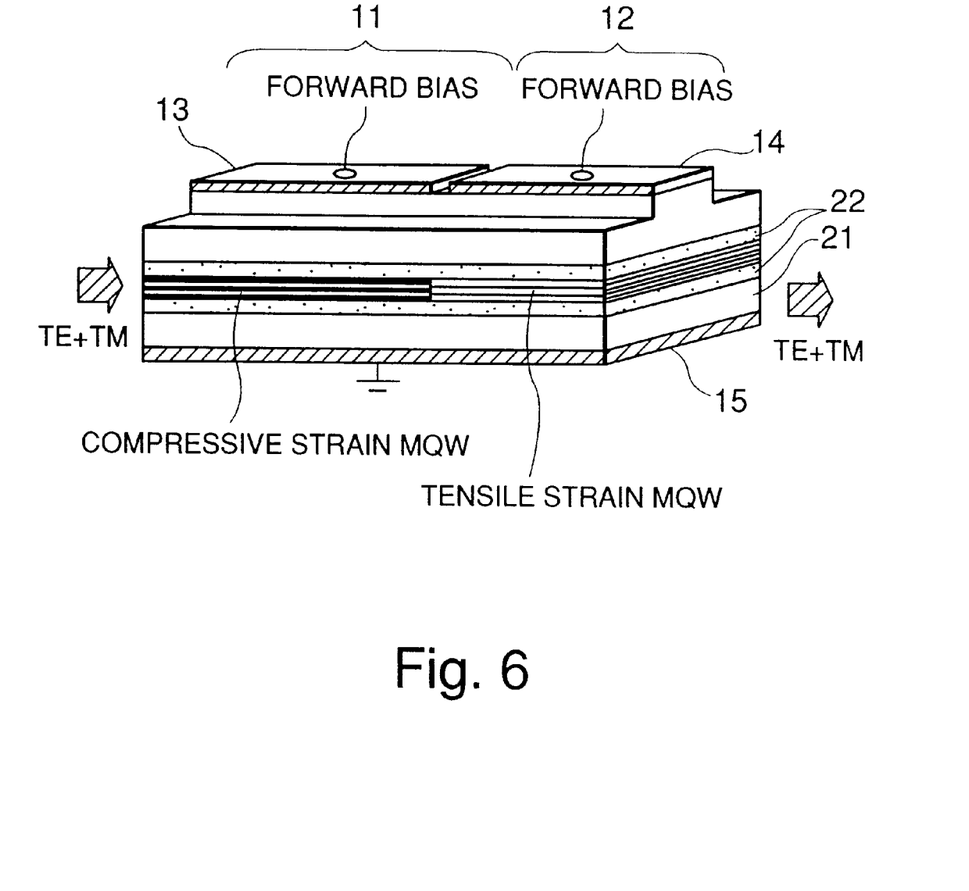
FIG. 6 is a view showing an embodiment in the case where a semiconductor optical functional device of the present invention is used as an integrated polarization mode independent amplification semiconductor amplifier.

FIG. 6 is a view showing an embodiment in the case where a semiconductor optical functional device of the present invention is used as an integrated polarization mode independent amplification semiconductor amplifier.

As shown in FIG. 6, forward bias voltages are applied to both a first region 11 having a compressive strain MQW structure and a second region 12 having a tensile strain MQW structure, and the bias voltages applied to the respective regions are adjusted so that gains of the TE mode and TM mode are independently controlled. Accordingly, the semiconductor device functions as the integrated polarization mode independent amplification semiconductor amplifier.

The present invention is structured as described above, so that the following effects can be obtained.

According to a first and second aspects of the present invention, the region having the compressive strain MQW structure is disposed in the first region, and the region having the tensile strain MQW structure is disposed in the second region, so that the semiconductor optical functional device is capable of independently controlling transmissivities for the light having the TE mode component and the light having the TM mode component.

According to a third and fourth aspects of the present invention, bias voltages different from each other are applied to the electrodes disposed on the first region and the second region, so that the semiconductor optical functional device can be driven as the semiconductor integrated polarization mode converter which converts the component of incident light and outputs the converted light.

According to a fifth and sixth aspects of the present invention, bias voltages different from each other are applied to the electrodes disposed on the first region and the second region, and in the application of the forward bias voltage, the bias voltage is made so small that laser oscillation does not occur in the region to which the bias voltage is applied, so that when light having the TE mode component and TM mode component is inputted, the semiconductor optical functional device can be driven as the semiconductor integrated polarization mode filter in which only light of either one of the components is passed through and is outputted.

As a result, when the semiconductor optical functional device is used for an optical fiber communication system, minute returning light from an optical fiber is absorbed, so that a fear of causing a transmission code error can be eliminated.

According to a seventh aspect of the present invention, adjusted forward bias voltages are applied to the electrodes disposed on the first region and the second region, so that the semiconductor optical functional device can be driven as the integrated polarization mode independent amplification semiconductor amplifier which independently controls the respective gains of the TE mode component and TM mode component of incident light and outputs the controlled light.

Further, when this structure is monolithically integrated with a semiconductor laser, it is also possible to control the polarization of output light from the semiconductor laser.

While the present invention has been described in connection with certain preferred embodiments, it is to be understood that the subject matter encompassed by way of the present invention is not to be limited to those specific embodiments. On the contrary it is intended for the subject mattter of the invention to include all alternatives, modifications and equivalents as can be included within the spirit and scope of the following claims.

What is claimed is:

1. A semiconductor optical functional device, comprising:
 a first region; and
 a second region adjacent to the first region in a longitudinal direction of a semiconductor optical waveguide, wherein;
  the first region includes an MQW structure in which a compressive strain in which a compressive strain is introduced into a well;
  the second region includes an MQW structure in which a tensile strain is introduced into a well;
  and the first region and the second region each include an upside electrode and a downside electrode opposing said upside electrode formed separately and independently from each other.

2. A semiconductor optical functional device comprising:
 a first region; and
 a second region adjacent to the first region in a longitudinal direction of a semiconductor optical waveguide, wherein;
  the first region includes an MOW structure in which a compressive strain is introduced into a well;
  the second region includes an MOW structure in which a tensile strain is introduced into a well;
  the first region and the second region include electrodes formed separately and independently from each other, respectively; and
  the first region and the second region perform an amplifying operation when a forward bias voltage is applied to the electrode, and perform and absorbing operation when a reverse bias voltage is applied to the electrode.

3. A method of driving a semiconductor optical functional device having a first region including an MQW structure in which a compressive strain is introduced into a well thereof, and a second region adjacent to the first region in a longitudinal direction of a semiconductor optical waveguide and including an MQW structure in which a tensile strain is introduced into a well thereof, said first region and second region including electrodes formed separately and independently from each other, respectively, said first region and second region perform an amplifying operation when a forward bias voltage is applied to the electrode, and perform an absorbing operation when a reverse bias voltage is applied to the electrode, said method comprising:
 applying a reverse bias voltage to the electrode disposed on the first region; and
 applying a forward bias voltage to the electrode disposed on the second region,
 whereby when light having a TE mode component is inputted into the first region, the semiconductor optical functional device is driven as a semiconductor integrated polarization mode converter in which the incident light is converted into light having a TM mode and is outputted.

4. A method of driving a semiconductor optical functional device having a first region including an MQW structure in which a compressive strain is introduced into a well thereof, and a second region adjacent to the first region in a longitudinal direction of a semiconductor optical waveguide and including an MQW structure in which a tensile strain is introduced into a well thereof, said first region and second region including electrodes formed separately and independently from each other, respectively, said first region and second region perform an amplifying operation when a forward bias voltage is applied to the electrode, and perform an absorbing operation when a reverse bias voltage is applied to the electrode, comprising:
 applying a forward bias voltage to the electrode disposed on the first region; and applying a reverse bias voltage to the electrode disposed on the second region, whereby when light having a TM mode component is inputted into the first region, the semiconductor optical functional device is driven as a semiconductor integrated polarization mode converter in which the incident light is converted into light having a TE mode and is outputted.

5. A method of driving a semiconductor optical functional device having a first region including an MQW structure in which a compressive strain is introduced into a well thereof, and a second region adjacent to the first region in a longitudinal direction of a semiconductor optical waveguide and including an MQW structure in which a tensile strain is introduced into a well thereof, said first region and second region including electrodes formed separately and independently from each other, respectively, said first region and second region perform an amplifying operation when a forward bias voltage is applied to the electrode, and perform an absorbing operation when a reverse bias voltage is applied to the electrode, comprising:

applying a reverse bias voltage to the electrode disposed on the first region; and applying a forward bias voltage to the electrode disposed on the second region, the forward bias voltage being less than a value required to support lasing in the second region, whereby when light having a TE mode component and a TM mode component is inputted into the first region, the semiconductor optical functional device is driven as a semiconductor integrated polarization mode filter in which light having the TM mode component is passed through and is outputted.

6. A method of driving a semiconductor optical functional device having a first region including an MQW structure in which a compressive strain is introduced into a well thereof, and a second region adjacent to the first region in a longitudinal direction of a semiconductor optical waveguide and including an MQW structure in which a tensile strain is introduced into a well thereof, said first region and second region including electrodes formed separately and independently from each other, respectively, said first region and second region perform an amplifying operation when a forward bias voltage is applied to the electrode, and perform an absorbing operation when a reverse bias voltage is applied to the electrode, comprising:

applying a forward bias voltage to the electrode disposed on the first region, the forward bias voltage being less than a value required to support lasing in the first region; and applying a reverse bias voltage to the electrode disposed on the second region, whereby when light having a TE mode component and a TM mode component is inputted into the first region, the semiconductor optical functional device is driven as a semiconductor integrated polarization mode filter in which light having the TE mode component is passed through and is outputted.

7. A method of driving a semiconductor optical functional device having a first region including an MQW structure in which a compressive strain is introduced into a well thereof, and a second region adjacent to the first region in a longitudinal direction of a semiconductor optical waveguide and including an MQW structure in which a tensile strain is introduced into a well thereof, said first region and second region including electrodes formed separately and independently from each other, respectively, said first region and second region perform an amplifying operation when a forward bias voltage is applied to the electrode, and perform an absorbing operation when a reverse bias voltage is applied to the electrode, comprising:

applying adjusted forward bias voltages to the electrodes disposed on the first region and the second region, whereby when light having a TE mode component and a TM mode component is inputted into the first region, the semiconductor optical functional device is driven as an integrated polarization mode-independent amplification semiconductor optical amplifier which independently controls gains of the respective TE mode component and the TM mode component, and outputs light from the second region.

* * * * *